United States Patent
Basto et al.

(10) Patent No.: US 6,675,364 B1
(45) Date of Patent: Jan. 6, 2004

(54) INSERTION OF SCAN HARDWARE

(75) Inventors: Luis A. Basto, Austin, TX (US); Mark T. Fox, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/323,469

(22) Filed: Jun. 1, 1999

(51) Int. Cl.[7] .................................................. G06F 17/50
(52) U.S. Cl. .................................. 716/6; 716/4; 716/5
(58) Field of Search ................................ 716/6, 4, 5

(56) References Cited

U.S. PATENT DOCUMENTS

| | | | | |
|---|---|---|---|---|
| 5,428,770 A | * | 6/1995 | Garner | 714/733 |
| 5,680,543 A | * | 10/1997 | Bhawmik | 714/30 |
| 6,289,498 B1 | * | 9/2001 | Dupenloup | 716/18 |
| 6,434,733 B1 | * | 8/2002 | Duggirala et al. | 716/11 |

OTHER PUBLICATIONS

Torre et al, "Model Generation of Test Logic for Macrocell Based Designs ", IEEE, 1996.*

* cited by examiner

*Primary Examiner*—Matthew Smith
*Assistant Examiner*—Brandon Bowers
(74) *Attorney, Agent, or Firm*—Akin Gump Strauss Hauer & Feld LLP

(57) ABSTRACT

According to the present invention, a method for inserting scan hardware into Integrated Circuits (IC) such as microcontrollers is disclosed. Custom scripts used by electronic design automation (EDA) tools are configured to accommodate those microcontroller designs that operate with multiple clocks and legacy cores. Furthermore, according to the present invention, custom script are used to provide buffering circuits to drive the scan hardware.

14 Claims, 8 Drawing Sheets

INSERTION OF SCAN HARDWARE

BACKGROUND OF THE INVENTION

1. Field of the Invention

The present invention relates to integrated circuits (IC), more particularly to insertion of scan hardware using electronic design automation (EDA) tools.

2. Description of the Related Art

With regularity over the past years, integrated circuits (IC) such as microcontrollers have gotten smaller, yet in the meanwhile have become more powerful. Today, it is not uncommon for a microcontroller to contain millions of transistors. Naturally, the job of designing these electronic circuits has also grown correspondingly more difficult. What was once accomplished by a single designer or a small group of designers, the job of designing microcontrollers must now be typically performed by a large team of designers or multiple teams of designers.

Specialized microcontrollers with integrated communication features are becoming particularly attractive for communication applications. A microcontroller, or an embedded controller, is uniquely suited to combining functionality onto one monolithic semiconductor substrate (i.e., chip). By embedding various communication features within a single chip, a communications microcontroller may support a wide range of communication applications.

Furthermore, designers used manual design techniques, i.e., components laid out by hand on blueprints, to design ICs. With today's complex design and competitive pressures to provide new generation of products having improved function and performance, companies typically use design automation (DA) technology utilizing computer-aided design (CAD) or computer-aided engineering (CAE). One type of DA known as electronic design automation (EDA) involved the designer's use of computer programs for the design and test of ICs. The EDA computer programs are often called applications or tools.

Using the EDA tool, a design engineer can break a large circuit into smaller functional units and specify constraints and requirements such as desired inputs and outputs of the functional units. The EDA tool then suggests solutions, often drawing on a vast digital library of possible circuits. In this manner, large circuits are decomposed into more manageable units that can be designed individually, perhaps by groups of design engineers working more or less independently. The result is that the overall design process is significantly faster than it would be otherwise.

For example, United Design Automation, Inc. of Austin, Tex. publishes Silicon Arena, a software package that provides, among other things, a graphical synthesis environment in which a design engineer can constrain and synthesize a design using a set of templates for creating logic synthesis command scripts. Information relative to a specific design may be stored in template files and compiled into a design run as needed. Silicon Arena provides a mechanism for maintaining and sharing synthesis scripts and parameters. Silicon Arena enables a user to create a gate-level netlist (a short hand description of a schematic indicating connections among larger elements) including Design for Test (DFT) scan chains. In particular, the Silicon Arena synthesis page allows a user to configure synthesis constraints, compiled high-level Register Transfer Level (RTL) code which takes into account the constraints, generate data for other teams of design engineers who place and route the design in light of constraints, and generates schematics used for final circuit layout configuration. Silicon Arena thus gives the users the ability to easily constrain and synthesis a design using a known set of synthesis templates.

Therefore, as a result of circuits becoming increasing complex, DFT tools have become increasingly important by insuring the ability to test the circuit. Automated test tools such as FastScan and FlexTest both published by Mentor Graphics of Wilsonville, Oreg., have been developed to provide this functionality. During the design process, selected sequential elements such as flip-flops and latches are replaced with their scan equivalent elements. In addition, sets and resets are modified so that they are not asserted during testing, and three-state buses are modified to reduce conflicts. Also, an Automatic Test Pattern Generator (ATPG) may generate a set of "scan vectors" to provide a high volt coverage of a circuit. More sophisticated testing procedures that employs scan cells, such as latches or flip-flops, together forming a scan chain, built into the circuit can perform testing at a functional unit level.

Thus, the importance of EDA tools is evident. However, current EDA tools suffer from many shortcomings. First, the EDA tools generally cannot automatically insert scan cells into circuits that utilize multiple clocks. Timing conflicts result in the scan chain when scan cells operate at different frequencies. In addition, due to the size and complexity of scan chain, current EDA tools do not take into account the drivers needed for the complex scan chain. Furthermore, EDA tools generally cannot be used to automatically insert scanned cells into ICs that include legacy cores. When an IC is in the scan mode, the outputs of the legacy cores are not taken into account, resulting in erroneous test data.

SUMMARY OF THE INVENTION

Current EDA tools suffer from many short comings that affect design and manufacture of integrated circuits, such as microcontrollers. According to one embodiment of the present invention, a script in a high-level language, such as VHDL (VHSIC Hardware Description for Language) or Verilog® or Synopsys Synthesis Script (Synopsys, Inc. of Mountain View, Calif.), for circuit incorporating elements utilizing multiple clocks is written to incorporate multiplexers in a scan chain. The script is compiled or synthesized into a netlist. Multiplexing in a single clock into scan cells allows scan data to be clocked out while the microcontroller is in a scan mode.

Next, according to an embodiment of the present invention, a script in a high-level language, such as VHDL or Verilog® or Synopsys Synthesis Script, for a circuit incorporating many scan cells, is written to incorporate drivers for a SCAN_EN signal cells. For complex scan chains, additional drivers generally need to be incorporated into the circuit to drive the scan chain.

Next, a script in a high-level language, such as VHDL or Verilog® or Synopsys Synthesis Script, for a circuit incorporating many scan cells is written to incorporate a fake clock. The fake clock is used to force the EDA tool to have different scan chains for each clock domain. This results in fewer scan chains crossing clock boundaries. Once the scan chains are inserted, the fake clocks are removed and synthesis continues.

Last, according to one aspect of the present invention, a script in a high-level language, such as VHDL or Verilog® or Synopsys Synthesis Script, for a circuit incorporating legacy cores is written to isolate legacy cores from scan testing. Signals from the legacy core generally have little controllability since it comes from a legacy core without scan or other recent test ability techniques. These output signals are isolated from affecting the other blocks under test to provide full control and observability to these signals.

BRIEF DESCRIPTION OF THE DRAWINGS

A better understanding of the present invention can be obtained when the following detailed description of the preferred embodiment is considered in conjunction with the following drawings, and which.

DETAILED DESCRIPTION OF INVENTION

Figure 1:
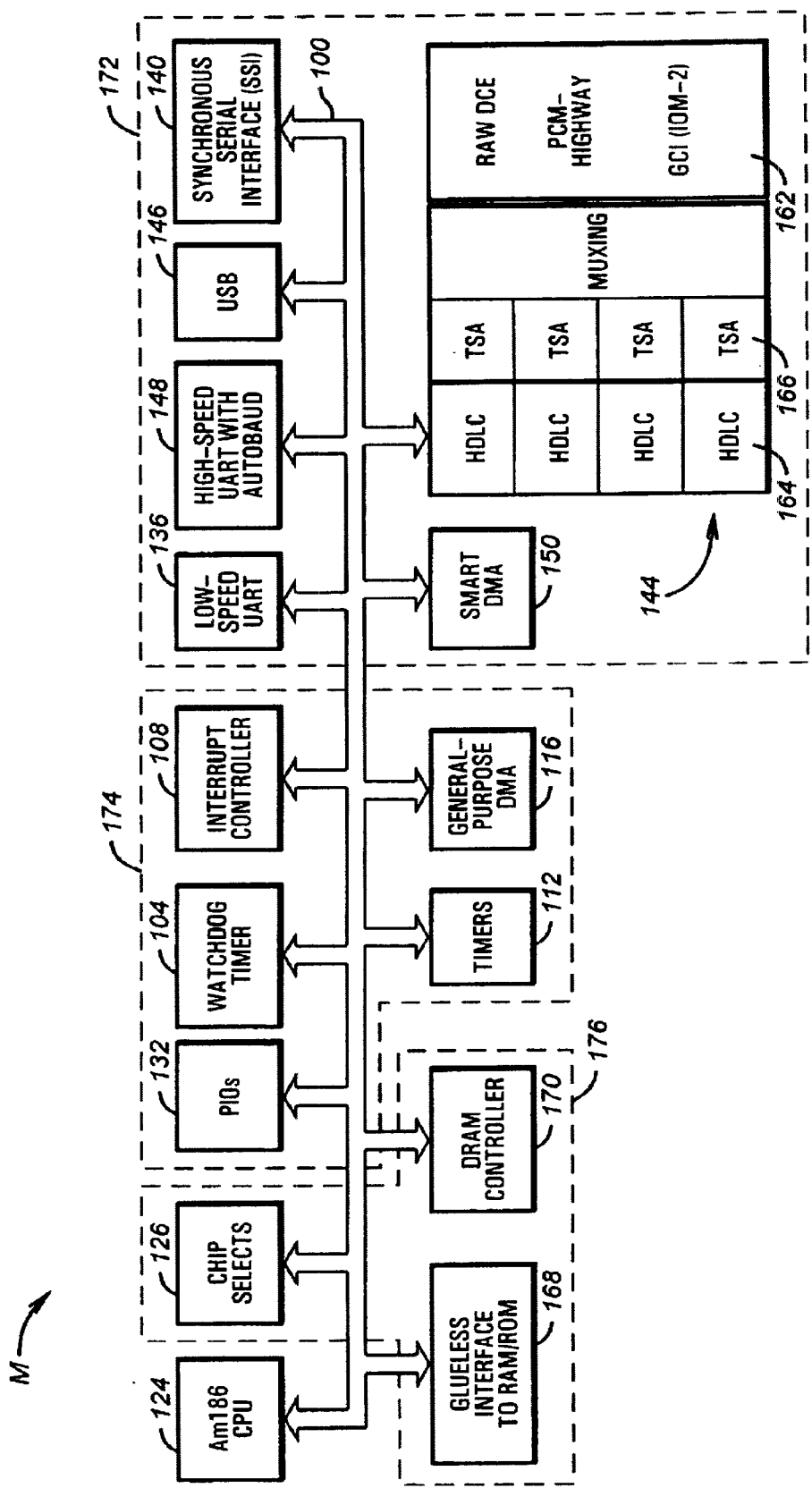
FIG. 1 is a block diagram of a typical microcontroller implemented according to the present invention.

Turning to FIG. 1, shown is a block diagram of a typical microcontroller M that could be evaluated using a logic system according to the invention. Such a microcontroller is preferably implemented on a single monolithic integrated circuit.

The microcontroller M preferably includes an internal bus 100 coupling, an execution unit 124, system peripherals 174, memory peripherals 176 and serial communication peripherals 172. The execution unit 124 in the disclosed embodiment is compatible with the AM186 instruction set implemented in a variety of microcontrollers from Advanced Micro Devices, Inc., of Sunnyvale, Calif. A variety of other execution units could be used instead of the execution unit 124. The system peripherals 174 include a watch dog timer (WDT) 104 for generating non-maskable interrupts (NMIs), microcontroller resets, and system resets. An interrupt controller 108 for supporting thirty-six maskable interrupt sources through the use of fifteen channels is also provided as a system peripheral. One disclosed system peripheral is a three channel timer control unit 112. The timer control unit 112 includes three 16-bit programmable timers. Another system peripheral is a general purpose direct memory access (DMA) unit 116 with four channels 0–3. The microcontroller M further supports user programmable input/output signal (PIOs). In the disclosed embodiment, forty-eight PIOs are provided.

The memory peripherals 176 of the disclosed microcontroller include a DRAM controller 170, a glueless interface 168 to a RAM or ROM, and a chip select unit 126. In the disclosed embodiment, the DRAM controller 170 is fully integrated into the microcontroller M. In the disclosed embodiment, the chip select unit 126 provides six chip select outputs for use with memory devices and eight chip select outputs for use with peripherals.

A low speed serial port implemented as a universal asynchronous receiver/transmitter (UART) 136 is provided as a serial communication peripheral. The low speed UART 136 is typically compatible with a standard 16550 UART known to the industry. Another serial communication peripheral in the disclosed embodiment is a synchronous serial interface (SSI) 140. Preferably the microcontroller M acts as a master in the synchronous serial interface 140, which is a standard synchronous serial channel.

The microcontroller M in the disclosed embodiment is particularly well suited to communications environments. To this end, the serial communication peripherals 172 of the microcontroller M include a number of high speed communication controllers, including a High-level Data Link Control (HDLC) controller 144, a Universal Serial Bus (SB) controller 146, and a high speed serial port (HSUART) 148. The disclosed HDLC controller 144 provides four HDLC channels 164. The HDLC channels 164 and the USB controller 146 can be written to and read from by a "Smart-DMA" unit 150, a unit which provides for chained buffers that are accessed via pairs of DMA channels. The Smart-DMA unit 150 allows for a high degree of packetized transfer without excessive execution unit 124 intervention. The SmartDMA unit 150 preferably consists of four Smart-DMA controllers, SmartDMA0–3, that each consists of a pair of DMA channels.

The HSUART 148 serves to form an asynchronous serial link across a bus to devices external to the microcontroller M. The asynchronous nature indicates that the HSUART 148 does not provide a separate clock signal to clock the data. Instead the rate at which data is sent and received must be predetermined or determined through autobauding and independently controlled on sending and receiving ends. This data rate is known as the baud rate. In accordance with the present invention, the HSUART 148 performs automatic baud detection with adjustment to a programmable baud rate as discussed below. It should be understood that the microcontroller M may include multiple HSUARTs 148. While a microcontroller is one potential device for providing an asynchronous receiver/transmitter in accordance with the present invention, an asynchronous receiver/transmitter may alternatively be provided independently or in connection with other devices. The nature of the particular device used in connection with an asynchronous receiver/transmitter is not critical to the present invention.

The disclosed HDLC controller 144 also includes an interface multiplexer 162. This multiplexer 162 couples the four HDLC channels 164, four time slot assignors (TSA) 166, and a number of external buses. Specifically, using the time slot assignors or otherwise, the HDLC channels 164 can be selectively coupled to a pulse code modulation (PCM) highway, a general circuit interface (GCI), an ISDN oriented modular interface revision 2 (IOM-2) serial bus, a data carrier equipment (DCE) serial interface, and other general and specific interfaces that often use packetized communication. Further, the HDLC channels 164 support HDLC, SDLC, Link Access Procedures Balanced (LAPB), Link Access Procedures on the D-channel (LAPD), and PPP, and as noted above, each include an independent time slot assignor 166 for assigning a portion of a serial frame to each HDLC for isochronous or isochronous-type communication.

In a computer aided engineering (CAE) environment, integrated circuits such as the microcontroller M of FIG. 1 are usually created via schematic or a high-level language, such as VHDL (VHSIC Hardware Description Language) or Verilog®, and then translated into a symbolic representation of the integrated circuit in the form of a netlist. Generally speaking, a netlist provides information concerning the number and types of elements in a circuit and the manner in which they are interconnects For example, a netlist might include a list of circuit element terminals connected on a common net. Thus, if a first AND gate receives one input from an inverter and a second input from an OR gate, and provides an output to both) a NOR gate and a second AND gate, the netlist would indicate that a first net connects an output connector of the inverter and one input connector of the first AND gate. A second net would connect an output connector of the OR gate and another input connector of the first AND gate. Finally, a third net would connect an output connector of the first AND gate, and input connector of the NOR gate, and input connector of the second AND gate.

It should be noted, however, that netlist are not restricted to use in describing logic diagrams. In a netlist, the interconnected circuit elements, typically referred to as cells, may be as simple as a resistor, or as complex as a microprocessor. Furthermore, netlist can also contain attribute information, for example how wide a physical trace is to be or how much capacitance is to be allowed on a trace. One way in which a netlist is generated is as a result of logic synthesis. Simply, a logic synthesis tool may receive as an input a Boolean expressing in terms of a state table, and generate a netlist including the logic circuits and the interconnections which would implement the given Boolean function.

A netlist could also be produced as an output from a typical script compiler. A script compiler will usually receive a high-level schematic as an input, and produce a netlist output providing more detailed circuit information. For example, a high-level schematic may include a script element such as a scan chain. The script compiler may produce a standard netlist representing a scan chain, which standard netlist would be incorporated into the netlist of the overall circuit.

A scan chain can be internal or external to various peripherals of microcontroller M. Data from the input or output of the various peripherals and various internal peripheral elements, such as flip-flops, may be included in the scan chain. Scan cells are coupled to these elements, thus in effect mirroring the elements, and when the microcontroller M is in a particular operating mode, such as in the scan mode, data from these scan cells are serially shifted out of the various scan cells.

As shown in the Appendix, a script written in Synopsys Synthesis Script is disclosed. The script is then synthesized (or compiled) into a netlist and later implemented as an integrated circuit, such as the microcontroller M.

Insertion of Multiplexers in a Mulitple Clock Design

As discussed previously, the EDA tools typically cannot be configured to adequately insert scan cells in a multiple clock design Thus, custom scripts are written to overcome the shortcomings of the EDA tools.

Figure 2:
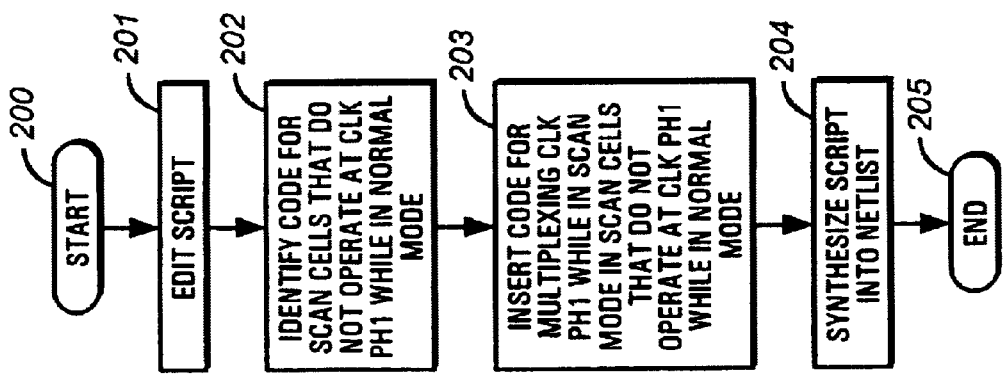
FIG. 2 is a flowchart of a methodology for multiplexing in a single clock signal while the microcontroller M is in the scan mode.

As shown in FIG. 2, a method for revising a script to incorporate multiplexers in a multiple clock design, the method starts at 200. The script is edited at step 201. Within the script, code for scan cells that do not operate at CLK PH1 while in normal mode is identified at step 202. Code for multiplexing CLK PH1 while in a scan mode into scan cells that do not operate at CLK PH1 while in a normal mode is inserted at step 203. The script is synthesized (or compiled) into a netlist at step 204. The method ends at step 205.

Figure 3:
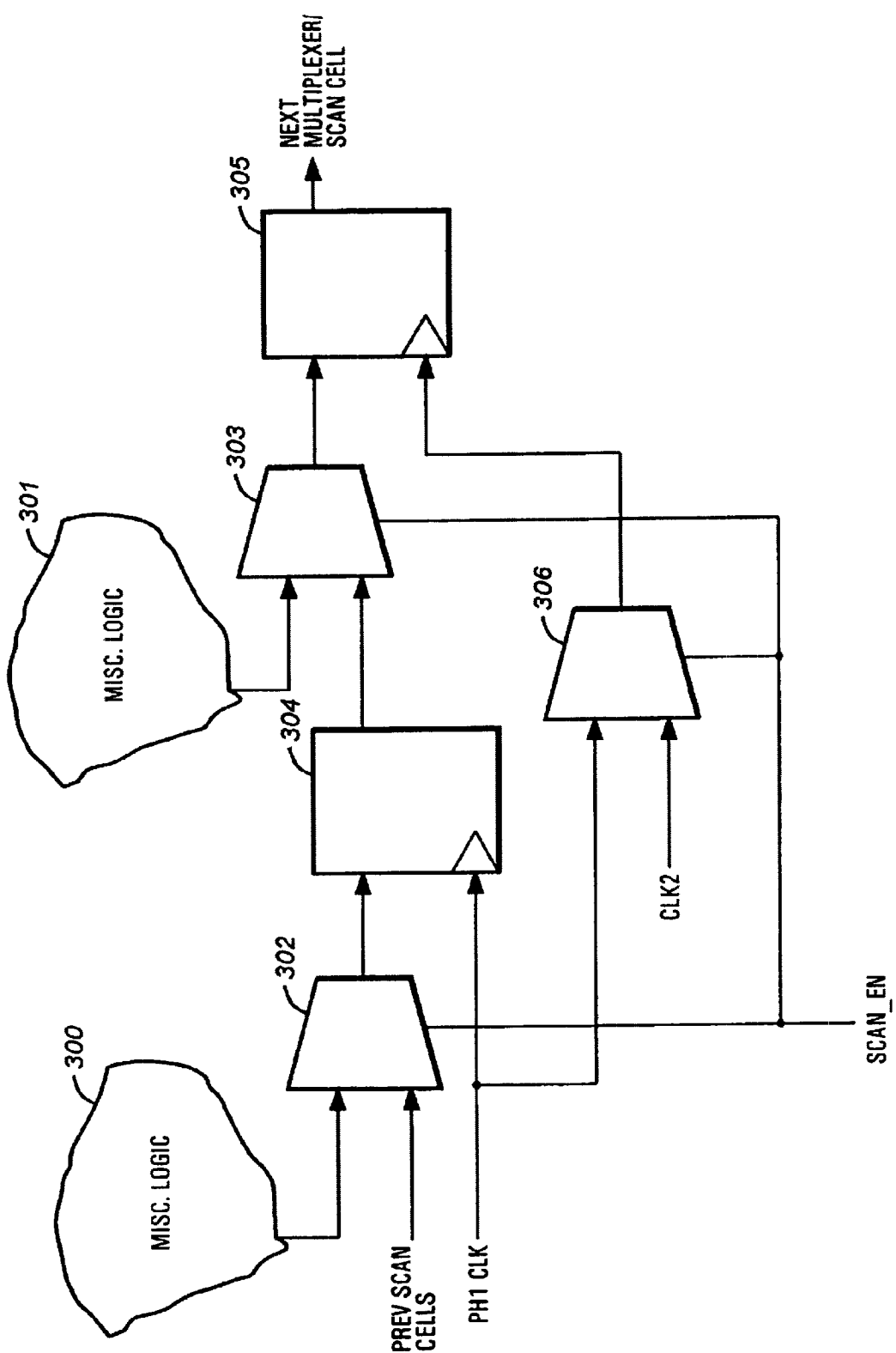
FIG. 3 is a logic diagram according to the methodology of FIG. 2.

FIG. 3 is a partial logic design equivalent of the revised script according to the methodology of FIG. 2. The figure (and other logic design figures) are but a small segment of a scan chain. Many more scan cells are generally included in the scan chain. Miscellaneous logic 300, 301 are associated with each scan cell 304, 305 respectively, such as latches. The miscellaneous logic 300, 301 could include combinational logic or an input/output of a peripheral of microcontroller M. As an example, scan cell 305, is typically clocked by a CLK2 while the microcontroller M is in the normal mode. When microcontroller M is in a scan mode, the scan enable signal SCAN_EN is provided to the multiplexer 306, and a clock signal PH1 is provided to the scan cell 305. When microcontroller M is a normal mode, the SCAN_EN system is not provided to the multiplexer 306, and a clock signal CLK2 is provided to the scan cell 305. Thus, when in the scan mode, the scan cells 304, 305, are clocked by PH1.

Insertion of Buffering Circuit

Figure 4:
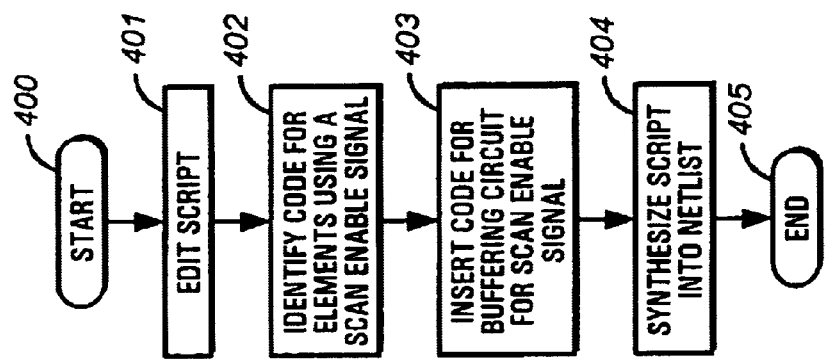
FIG. 4 is a flowchart of a methodology for adding buffers to a scan enable signal according to the present invention.

FIG. 4 shows a method for inserting a buffering circuit in a script is disclosed. The method begins at step 400. The script is edited at step 401. Code for elements using the scan enable signal SCAN_EN is identified in the script at step 402. The elements could include various devices such as multiplexers, latches, etc. Buffering circuit code for the scan enable signal SCAN_EN is inserted in the script at step 403. The script is then synthesized into a netlist at step 404. The method ends at step 405.

Figure 5:
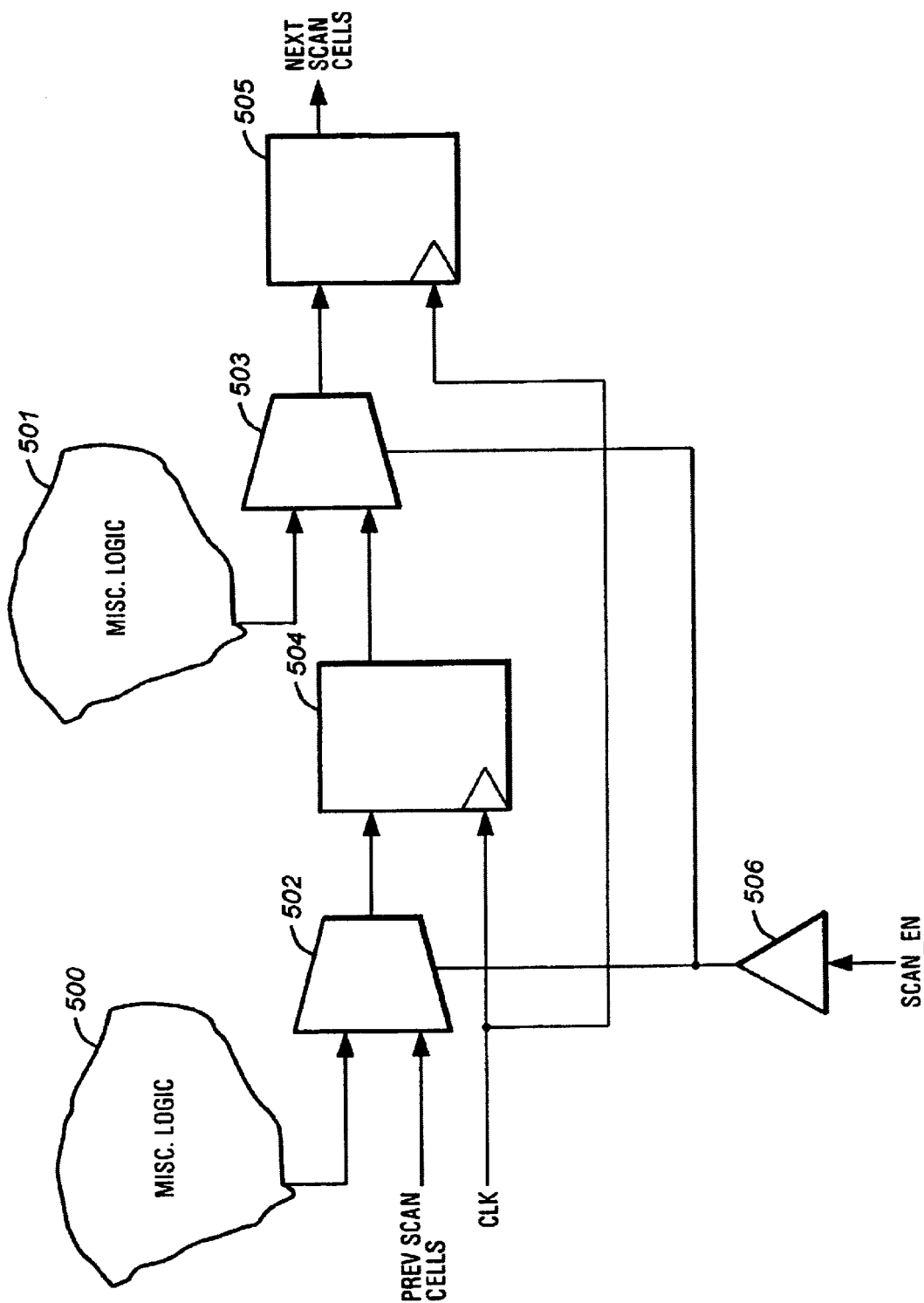
FIG. 5 is a logic design according to the methodology of FIG. 4.

A partial logic diagram for the synthesized script is shown in FIG. 5. When microcontroller M is in the normal mode, data from miscellaneous logic 500 is multiplexed into a scan cell 504. One skilled in the art would recognize that the miscellaneous logic could be a combinational logic or input/output data from a peripheral of microcontroller M. The scan enable signal SCAN_EN is driven by buffer 506, and this scan enable signal SCAN_EN is provided to various multiplexers 502 and 503. Thus, when microcontroller M is in the scan mode, data is shifted from one scan cell 504 to the next scan cell 505.

Insertion of Fake Clocks

Generally, scan cells use both phases of a clock and different clock sources as their main clocks. According to the present invention, the scan cells were to use only one PH1 clock while the microcontroller M is in the scan mode. As discussed previously, this required multiplexing in clock signal CLK PH1 to all scan cells. As a result, different delays would occur in the flip-flops while in the normal mode.

Figure 6:
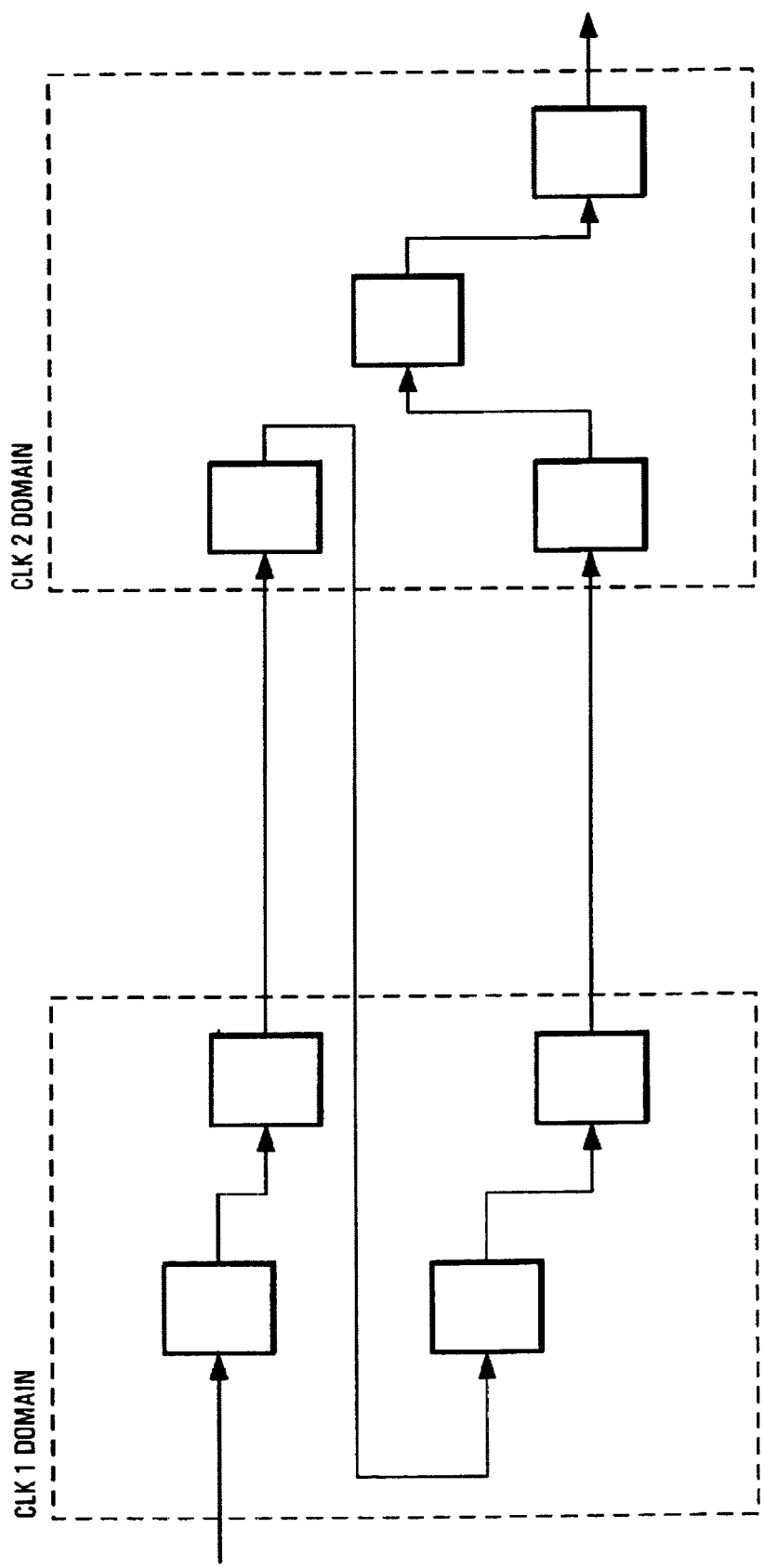
FIG. 6 is a logic diagram of scan cells in a multiple clock environment (Prior Art)

FIG. 6 shows how a typical EDA tool would insert a scan chain in microcontroller M. The EDA tool would connect various scan cells in a manner due to the scan cells physical proximity to one another. This would result in the scan cells crossing over different clock domains should one cell operating at one clock be located next to another scan cell operating at another clock.

Figure 7:
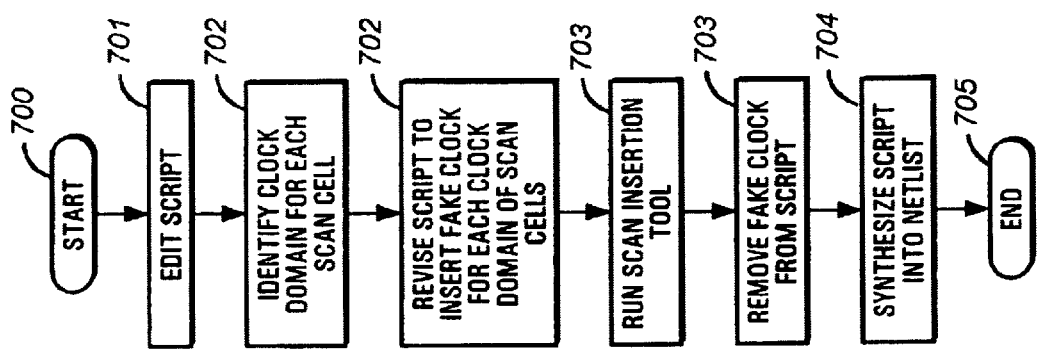
FIG. 7 is a flowchart of a methodology for minimizing the hold time violations caused by random scan chain connections.

FIG. 7 discloses a method for minimizing the hold time violation caused by the random scan chain connections of the EDA tools. The method starts at step 700. The script is edited at step 701. Clock domains for each scan cell is identified in the script at step 702. The code is revised to insert fake clocks for each clock domain at step 703. A scan insertion tool is run which groups scan cells into their respective clock domain and then all scan cells are connected into a single scan chain at 704. The script is then edited removing the fake clock at 705. The script is then synthesized into a netlist at 706. The method ends at 707.

Figure 8:
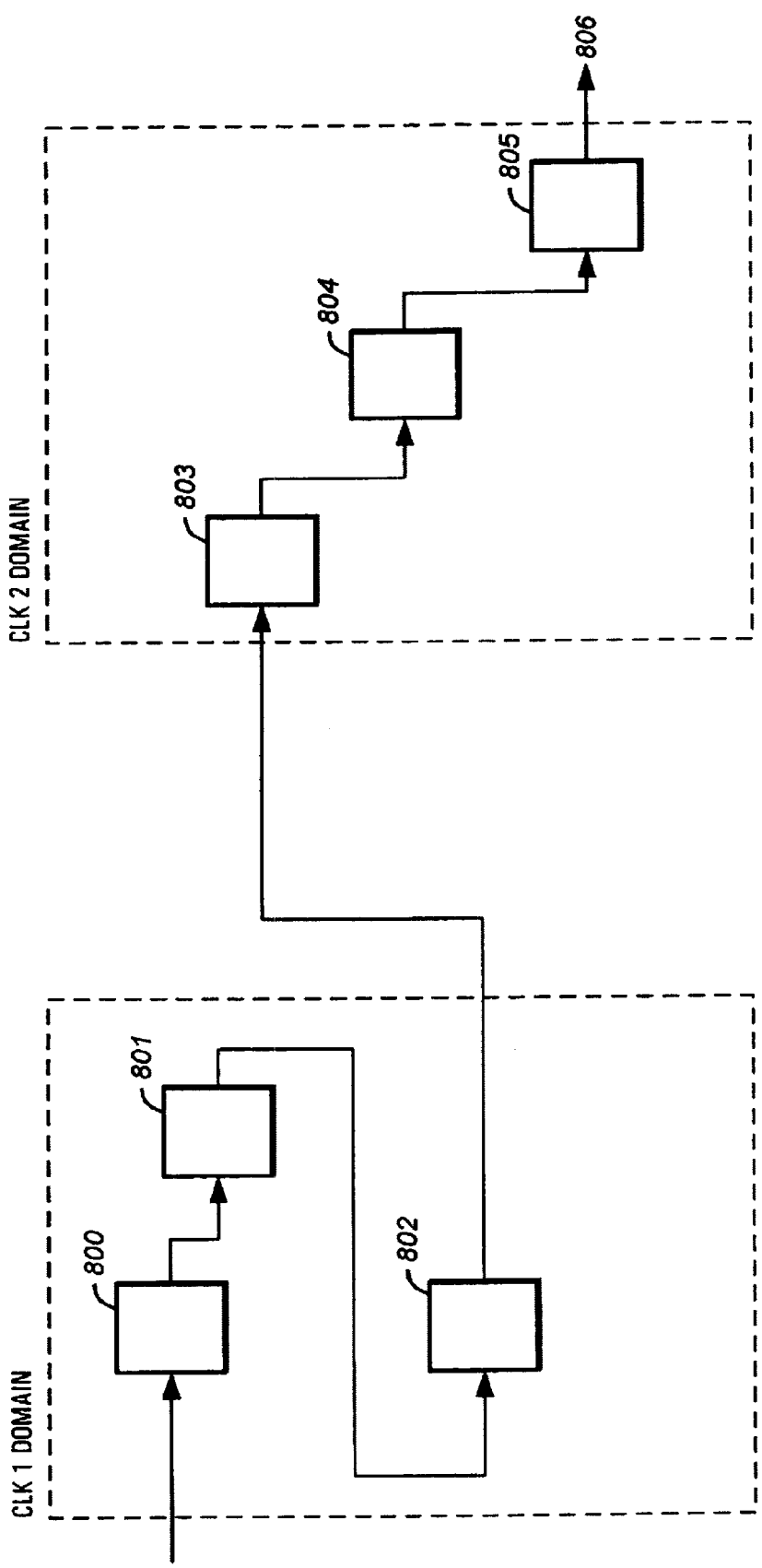
FIG. 8 is the logic design of the methodology of FIG. 7.

As shown in FIG. 8, a partial logic design is disclosed as a result of the methodology disclosed in FIG. 7. Scan cells of each clock domain are first grouped together. Scan cells 800, 801, 802 are driven by CLK1 while microcontroller M is in a normal mode. Scan cells 803, 804, 805 are clocked by CLK2 while microcontroller M is in the normal mode. Then each group of clocked domains are connected into one scan path 806. Thus random chain connections causing hold time violation is avoided.

Isolation of Legacy Cores while in a Scan Mode

Next, outputs from legacy cores need to be taken into account when the microcontroller M is in the scan mode. Legacy cores could be a CPU 124 or a BIU. These output signals need to be isolated from affecting the other blocks under test to provide full control and observability to these signals. A method for revising the script to isolate the legacy core outputs is disclosed.

Figure 9:
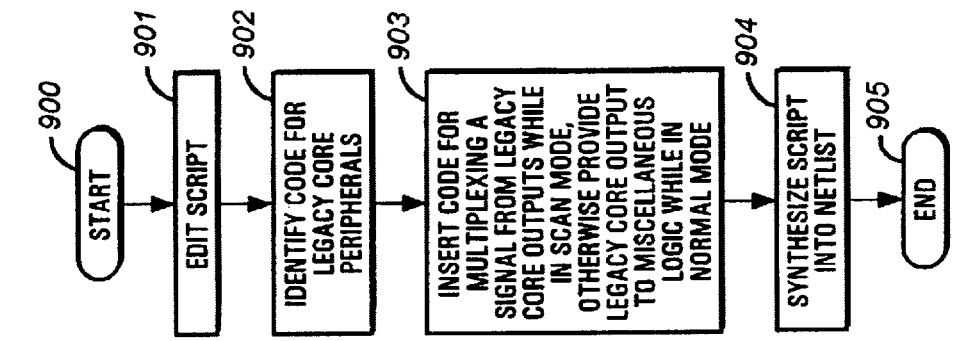
Figure 9 is a flowchart of the methodology for isolating legacy cores while the microcontroller M is in the scan mode.

In FIG. 9, the method begins at step 900. The script is edited at step 901. Code for legacy core peripherals is identified at step 902. Code for multiplexing ground signals (or logic "0") to miscellaneous logic from legacy core outputs while microcontroller M is in the scan mode, otherwise legacy core output signals are provided to miscellaneous logic while microcontroller M is in the normal mode, is inserted at step 903. The script is synthesized into a netlist at step 904. The method ends at step 905. Of course, one skilled in the art would know that the multiplexed signal 1005 need not have to be a ground signal, thus one skilled in that art could select some other known signal.

Figure 10:
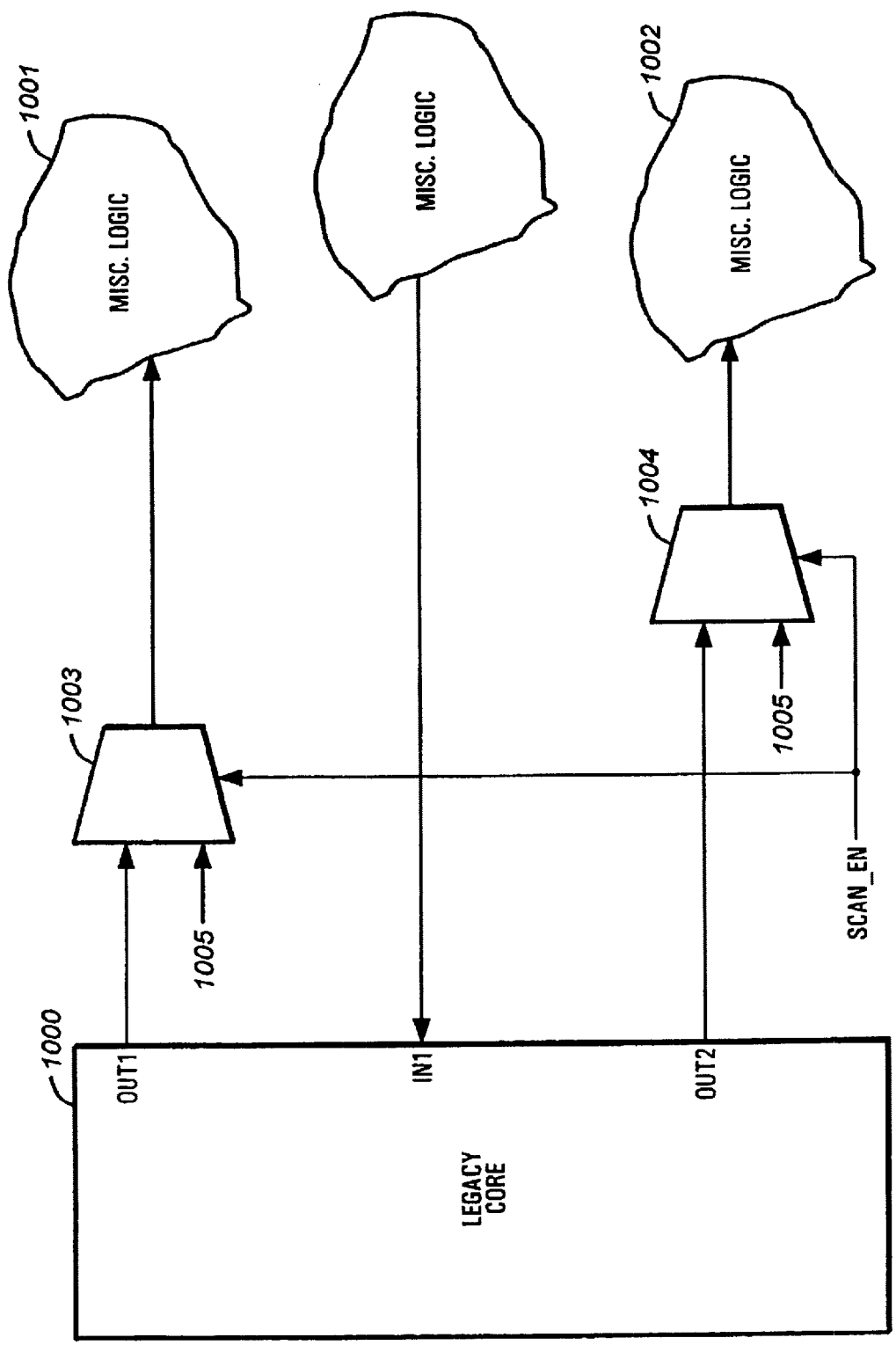
FIG. 10 is a logic diagram of the methodology of FIG. 9.

Shown in FIG. 10, a partial logic design representation of the netlist is disclosed. The output signal OUT1, OUT2 from the legacy core 1000 is provided to multiplexers 1003, 1004, respectively. The outputs of the multiplexers 1003, 1004 are provided to miscellaneous logic 1001, 1002, respectively. The multiplexers 1003, 1004 are driven by a scan enable signal SCAN_EN. When the microcontroller M is in the scan mode, a scan enable signal SCAN_EN is provided to the multiplexers 1003, 1004. When the multiplexers 1003, 1004 receive the scan enable signal SCAN_EN, grounds 1005 are outputted from the multiplexers 1003, 1004 to the various miscellaneous logic 1001, 1002. When the scan enable signal SCAN_EN is not provided, the multiplexers 1003, 1004 provide the output signals OUT1, OUT2 from the legacy core 1000 to the various miscellaneous logic 1001, 1002, respectively. Thus, when the microcontroller M is in a scan mode, legacy cores of the microcontroller M are isolated from the rest of the microcontroller.

The foregoing disclosure and description of the invention are illustrative and explanatory thereof, and various changes in the details of the illustrated apparatus and construction and method of operation may be made without departing from the spirit of the invention.

---

SOURCE CODE APPENDIX

```
/* This code has been added to allow the hdlc and usb modules to have specific
chains associated with clocks. By inserting FAKE_CLK, DFT will insert a chain
for that clock. After scan insertion, the FAKE_CLK is removed and the nets
are connected back as originally intended.         */
if ( (block == "hdlc") || (block == "usb")||(block == "hsuart") || (block == "uart") || (block == "ltb") ) {
    echo "Modifying netlist to allow for two scan chain insertion"
    remove_net find(net, "PH2")
    create_port FAKE_CLK -dir in
    create_net FAKE_CLK
    connect_net FAKE_CLK { find(port,"FAKE_CLK") }
/*  connect_net find(net, "PH2") { find(port,"FAKE_CLK") } */
    if (block == "hdlc") {
        connect_net FAKE_CLK { LOOPBACK/PH2 }
    } else if (block == "usb") {
        connect_net FAKE_CLK { UDC_WRAPPER/PH2 }
    } else if (block == "hsuart") {
        connect_net FAKE_CLK { HSP_BAUD/PH2 }
    } else if (block == "uart") {
        connect_net FAKE_CLK { LSP_BAUD/PH2 }
    } else if (block == ltb) {
        connect_net FAKE_CLK { PCB_INTERFACE/PH2 MISC/PH2 CS_DR_CNTR/PH2 }
    }
}
which SCAN_SCRIPT /* new style scan */
if ( dc_shell_status != { } ) { /* scan_script */
    write -f verilog -hierarchy -o FILEV_SCANIN
    cd ../scan
sh SCAN_SCRIPT > SCANLOG /* new style scan */
echo "Created Insert scan log file " + SCANLOG
echo
echo "--------------------------------------------------------------------"
echo "                                INSERT SCAN (UPDATE DB)"
echo
    cd ../syn
    which FILEV_SCANOUT
    if ( dc_shell_status != { } ) { /* SCANOUT dc_shell_status */
        remove_design -all
        read -f verilog FILEV_SCANOUT
        current_design = block
```

-continued

SOURCE CODE APPENDIX

```
            link
            if ( ( block == "hdlc") || (block == "usb") || (block == "hsuart") || (block == "uart") || (block == "
ltb") ) {
                        echo "Modifying netlist to connect PH2 to SCAN MODE clock"
                        remove_net find(net, "FAKE_CLK*")
                        remove_port FAKE_CLK
                        create_net PH2
                        connect_net PH2 find(pin,"*/PH2")
                  }
            which FILE_WIREDB      /* set wire load model */
            if (dc_shell_status != "") {
                  foreach (designname, find(design,"*") {
                        current_design = designname
                        set_wire_load FILE_WIRENAME
                  }
            } else {
                  echo "Wire load model " + FILE_WIREDB + "not found"
                  echo
            }
            current_design = block
            if(TIMING_SCRIPT != "") {
                  include TIMING_SCRIPT
                  if (dc_shell_status != 1) {
                        echo "Exit due to err" + "or in TIMING_SCRIPT"
                        exit
                  }
            } else {
                  echo "WARNING: No timing constraints script used"
            }
            if (LOADING_SCRIPT != "") {
                  include LOADING_SCRIPT
                  if (dc_shell_status != 1) {
                        echo "Exit due to err" + "or in LOADING_SCRIPT"
                        exit
                  }
            } else {
                  echo "WARNING: No loading constraints script used"
            }
/* This code is in order to prevent excessive loading on the SCAN_EN signal which is
added by scan insertion.
*/
echo
echo "-------------------------------------------------------------------------------"
echo "                              Balance Buffer - SCAN_EN "
echo
      all_designs = find (design, "*" -hier)
      set_dont_use umc035s_comlib/ssivcd* >/dev/null
      foreach (sub_design, all_designs) {
            current_design = sub_design
            scan_ports = find("port", "SCAN_EN*") >/dev/null
            if (dc_shell_status != { } ) {
                  set_max_fanout 2 scan_ports
                  set_driving_cell -cell ssiv scan_ports
                  test_cells = find("pin", "*/TE")
                  if (dc_shell_status != { } ) {
                        echo "Performing Balance buffer on " + current_design
                        balance_buffer -to test_cells -depth 3 > /dev/null
                  }
            }
      }
}
current_design = block
scan_ports = find("port", "SCAN_EN*")
set_max_fanout 4 scan_ports
set_driving_cell -cell ssiv scan_ports
echo "Performing Balance buffer on " + current_design
balance_buffer -from scan_ports -depth 3 > /dev/null
list UNTOUCHABLES
foreach (this, UNTOUCHABLES) {
      echo "Setting dont_touch on:" + this
      set_dont_touch find(design,this)
}
uniquify
set_dont_use umc035s_comlib/ssfd* > /dev/null
set_dont_use umc035s_comlib/ssfj* > /dev/null
remove_attribute umc035s_comlib/ssfd2d2q dont_use
remove_attribute umc035s_comlib/ssfd2q dont_use
remove_attribute umc035s_comlib/ssfd3d2q dont_use
```

-continued

SOURCE CODE APPENDIX

```
remove_attribute umc035s_comlib/ssfd3q dont_use
remove_attribute umc035s_comlib/ssfd4d2q dont_use
remove_attribute umc035s_comlib/ssfd4q dont_use
set_dont_use umc035s_comlib/ssld* > /dev/null
remove_attribute umc035s_comlib/ssld1 dont_use
remove_attribute umc035s_comlib/ssld1q dont_use
remove_attribute umc035s_comlib/ssld2 dont_use
    current_design = block
    if(TIMING_SCRIPT != "") {
        include TIMING_SCRIPT
            if (dc_shell_status != 1) {
                echo "Exit due to err" + "or in TIMING_SCRIPT"
                exit
            }
        } else {
            echo "WARNING:_No timing constraints script used"
        }
        if(LOADING_SCRIPT != "") {
            include LOADING_SCRIPT
            if (dc_shell_status != 1) {
                echo "Exit due to err" + "or in LOADING_SCRIPT"
                exit
            }
        } else {
            echo "WARNING: No loading constraints script used"
        }
    set_dont_touch find(cell,"TLKT_IN*" -hier)
    set_dont_touch find(cell,"TLKT_NR*" -hier)
    set_dont_touch find(cell,"TLKT_ND*" -hier)
    set_dont_touch find(cell,"TLKT_DF*" -hier)
    set_dont_touch find(cell,"TLKT_MX*" -hier)
    set_dont_touch_network CLOCKS
echo "--------------------------------------------------------------------------------"
echo "                            COMPILE AFTER SCAN INSERTION "
echo
    compile -incremental_mapping -map_effort high
    } else {
        echo "Err" + "or: Scan Job failed - Scan not inserted."
        echo "          check scan log file - " + SCANLOG
    }
} else {
    /* echo "Err" + "or: Scan Configuration file SCAN_CONFIG not found" /* old style scan
(tconfig based) */
    echo "Err" + "or: Scan Configuration file SCAN_SCRIPT not found" /* new style scan */
} else {
    echo "Scan not inserted for this block!"
    echo
}
echo
echo "Writing " + db/latest_prefh.db
echo
write -hierarchy -o db/latest_prefh.db
echo "**** Timing Results ***" > REP_HOLD
if (MAIN_CLK == "DST_CLK") {
echo
echo "Inserting scan out buffering"
echo "Creating new cells to buffer SCAN_OUT"
if (block == "dma") {
    create_cell { block + _so1_inv1 block + _so2_inv1 block + _so3_inv1 } umc035s_comlib/ssiv
    create_cell (block + _so1_inv2 block + _so2_inv2 block + _so3_inv2 } umc035s_comlib/ssivd3
} else {
    create_cell { block + _so1_inv1 block + _so2_inv1 } umc035s_comlib/ssiv
    create_cell { block + _so1_inv2 block + _so2_inv2 } umc035s_comlib/ssivd3
}
echo "Disconnecting SCAN_OUT ports from nets"
disconnect_net SCAN_OUT1 find(port, SCAN_OUT1)
disconnect_net SCAN_OUT2 find(port, SCAN_OUT2)
if (block == "dma") {
    disconnect_net SCAN_OUT3 find(port, SCAN_OUT3)
}
echo "Creating required new nets"
create_net { block + _so1_1_2 block + _SCAN_OUT1 block + _so2_1_2 block + _SCAN_OUT2 }
if(block == "dma") {
    create_net {block + _so3_1_2 block + _SCAN_OUT3 }
}
echo "Connecting nets to new cells"
connect_net SCAN_OUT1 block + _so1_inv1/A
```

-continued

SOURCE CODE APPENDIX

```
connect_net SCAN_OUT2 block + _so2_inv1/A
connect_net block + _so1_1_2 { block + _so1_inv2/A block + _so1_inv1/Y }
connect_net block + _SCAN_OUT1 { block + _so1_inv2/Y find(port SCAN_OUT1) }
connect_net block + _so2_1_2 { block + _so2_inv2/A block + _so2_inv1/Y }
connect_net block + _SCAN_OUT2 { block + _so2_inv2/Y find(port, SCAN_OUT2) }
if(block == "dma") {
    connect_net SCAN_OUT3 block + _so3_inv1/A
    connect_net block + _so3_1_2 { block + _so3_inv2/A block + _so3_inv1/Y }
    connect_net block + _SCAN_OUT3 { block + _so3_inv2/Y find(port, SCAN_OUT3) }
}
set_dont_touch find(cell, block + "_so*" -hier)
echo
echo "--------------------------------------------------------------------------------"
echo "                          FIX HOLD FOR SCAN MODE ONLY "
echo
            if(TIMING_SCRIPT != "") {
                include TIMING_SCRIPT
                if (dc_shell_status != 1) {
                    echo "Exit due to err" + "or in TIMING_SCRIPT"
                    exit
                }
            } else {
                echo "WARNING: No timing constraints script used"
            }
            if (LOADING_SCRIPT != "") {
                include LOADING_SCRIPT
                if (dc_shell_status != 1) {
                    echo "Exit due to err" + "or in LOADING_SCRIPT"
                    exit
                }
            } else {
                echo "WARNING: No loading constraints script used"
            }
    foreach (this, UNTOUCHABLES) {
        echo "Setting dont_touch on:" + this
        set_dont_touch find(design,this) false
    }
    set_dont_use umc035s_comlib/*d16*
    set_dont_use umc035s_comlib/*d12*
    set_dont_use umc035s_comlib/*d6*
    set_dont_use umc035s_comlib/*d8*
    set_dont_touch_network CLOCKS
    echo "Set false path to TE pins"
    set_false_path -to find(pin, "*/TE" -hier) > /dev/null
    echo "Set false path from all inputs"
    set_false_path -from all_inputs( ) - CLOCKS
    if (block == hsuart) {
        set_false_path -to find(cell,"RXFIFO32" -hier)
        set_false_path -to find(cell,"TXFIFO16" -hier)
    }
    set_disable_timing find(cell,"*scan*mux*" -hier) -from D0 -to YN
    set_disable_timing find(cell,"*scan*mux*" -hier) -from S -to YN
    timing_self_loops_no_skew = true
    set_fix_hold DST_CLK
    report_timing_requirements -ignored
    write -hierarchy -o db/latest_pre_fh.db
    compile -only_design_rule
    echo "**** SCAN MODE FIX HOLD Timing Results ***" >> REP_HOLD
    report_timing -delay min -from DST_CLK >> REP_HOLD
}
```

What is claimed is:

1. A method of constructing a scan chain in an integrated circuit with multiple clocks, comprising the steps of:
 updating a script, comprising the steps of:
  a) identifying scan cells in the script that do not operate at a first clock while in a first mode;
  b) inserting code for multiplexers that multiplexes the first clock while in a second mode into the scan cells that do not operate at the first clock, otherwise the multiplexers multiplex in a second clock into the scan cells while in the first mode; and compiling the script.

2. The method of claim 1, wherein the scan cells are flip-flops.

3. The method of claim 1, wherein the first mode is a normal mode and the second mode is a scan mode.

4. The method of claim 1, wherein the script is written in VHDL.

5. The method of claim 1, wherein the script is written in SYNOPSYS synthesis script.

6. A method of constructing a scan chain in a microcontroller with multiple clocks, comprising the steps of:
 updating a script, comprising the steps of:
  a) identifying scan cells in the script that do not operate at a first clock while in a first mode, said scan cells include data from registers of peripherals of the microcontroller;

b) inserting code for multiplexers that multiplexes the first clock while in a second mode into the scan cells that do not operate at the first clock, otherwise the multiplexers multiplex in a second clock into the scan cells while in the first mode; and compiling the script.

7. The method of claim 6, wherein the scan cells are flip-flops.

8. The method of claim 6, wherein the first mode is a normal mode and the second mode is a scan mode.

9. The method of claim 6, wherein the script is written in VHDL.

10. The method of claim 6, wherein the script is written in SYNOPSYS synthesis script.

11. The method of claim 6, wherein the peripheral is a direct memory access controller.

12. The method of claim 6, wherein the peripheral is a universal asynchronous receiver/transmitter.

13. The method of claim 6, wherein the peripheral is a universal serial bus controller.

14. The method of claim 6, wherein the peripheral is a dynamic random access memory controller.

* * * * *